United States Patent [19]
Choi et al.

[11] Patent Number: 5,796,756
[45] Date of Patent: Aug. 18, 1998

[54] SURVIVOR MEMORY DEVICE IN VITERBI DECODER USING TRACE DELETION METHOD

[75] Inventors: Hyung-Jin Choi; Sung-Bae Cho; Suk-Jin Jung; Hyung-Kil Lee, all of Suwon, Rep. of Korea

[73] Assignee: Samsung Electronics Co., Ltd., Kyungki-do, Rep. of Korea

[21] Appl. No.: 808,663

[22] Filed: Feb. 28, 1997

[30] Foreign Application Priority Data

Feb. 28, 1996 [KR] Rep. of Korea ............... 1996 4986

[51] Int. Cl.$^6$ .................................................. H03M 13/12
[52] U.S. Cl. ............................................................ 371/43.7
[58] Field of Search ............................................. 371/43.7

[56] References Cited

U.S. PATENT DOCUMENTS

| | | | |
|---|---|---|---|
| 5,280,489 | 1/1994 | Fredrickson et al. | 371/45 |
| 5,537,424 | 7/1996 | Karabed et al. | 371/43 |

OTHER PUBLICATIONS

Fettweis, G., "Algebraic Survivor Memory Management for Viterbi Detectors", SUPERCOMM/ICC '92, pp. 339–343, Dec. 1992.

Black, P. et al., "Hybrid Survivor Path Architectures for Biterbi Decorders", ICASSP '93, pp. I-433 –I-436, Dec. 1993.

Chern, S–J. et al., "A VLSI Architecture of SMU for Strongly Connected Viterbi Decoder", APCCAS '94, pp. 200–205, Dec. 1994.

"A New Survivor Memory Management Method in Veterbi Decoders", IEEE Globecom 1996 Conference Record vol. 1, pp. 126–130.

Primary Examiner—Stephen M. Baker
Attorney, Agent, or Firm—Sughrue, Mion, Zinn, Macpeak & Seas, PLLC

[57] ABSTRACT

A survivor memory device in a Viterbi decoder determines a final survivor path using a trellis diagram and decision vectors, and outputs decoded data corresponding to the determined survivor path. The survivor memory device includes a path existence information generator for receiving a plurality of decision vectors, and for generating first branch path existence information representing whether a branch path exists between each state and the corresponding next states in the trellis diagram. A plurality of units are serially connected with respect to the outputs of the path existence information generator. Each unit comprises a path existence information store for receiving and storing the first branch path existence information, a path removal signal generator for generating corresponding path removal signals when the first branch path existence information corresponding to each current state represents that corresponding branch paths do not exist between each current state and the corresponding next states, and a path existence information updator for receiving the first branch path existence information stored in the path existence information store and the path removal signals generated by the path removal signal generator, and for updating values of second branch path existence information corresponding to each current state to represent that corresponding branch paths do not exist between each current state and the corresponding previous states.

15 Claims, 6 Drawing Sheets

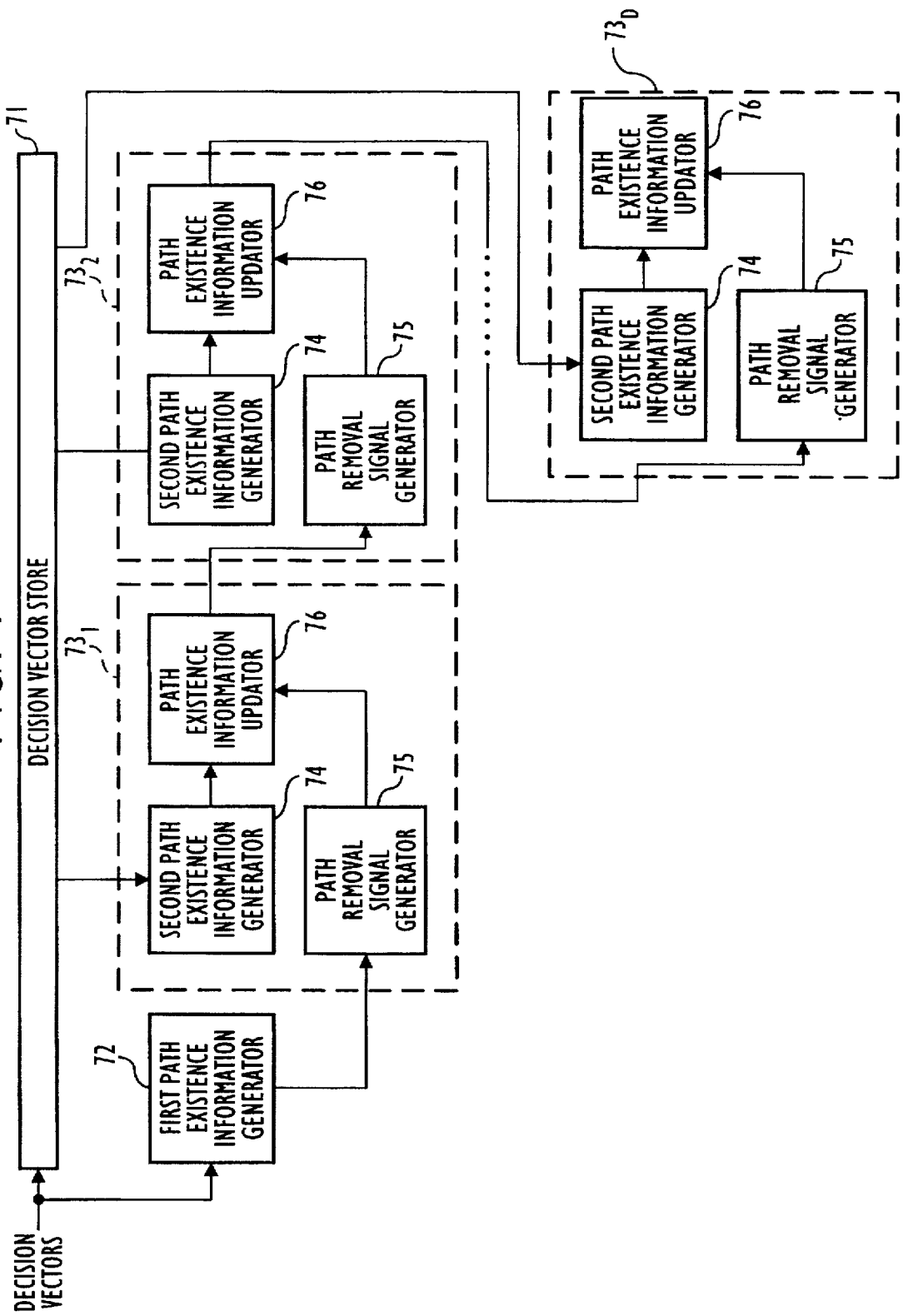

SURVIVOR MEMORY DEVICE IN VITERBI DECODER USING TRACE DELETION METHOD

BACKGROUND OF THE INVENTION

1. Field of the Invention

The present invention relates to a survivor memory device in a Viterbi decoder, and more particularly, to a survivor memory device capable of removing branch paths of previous states which are not connected to a next state in a trellis diagram.

2. Description of the Related Art

Generally, in a digital communication system, signals transmitted from a transmitter are altered due to noise imposed on a channel, and then the altered signals are received by a receiver. The digital communication system uses an error correcting code in order to reduce the error generated in the signals.

A trellis coded modulation (TCM) signal obtained by a convolutional coding and modulation technique, which is an error correcting coding technique, is decoded by a decoder implemented by a demodulator and a Viterbi algorithm. The Viterbi algorithm effectively performs a maximum likelihood sequence estimation (MLSE) and detects the TCM signal as well. The Viterbi algorithm is also used for detecting a convolutional code. The Viterbi algorithm performs maximum likelihood decoding and uses a trellis diagram to greatly reduce the amount of necessary calculations. The Viterbi algorithm compares the similarity between paths input to respective states of the trellis diagram and an input signal, to have only a single survivor path exist in a single state. This process is performed with respect to all time units in the trellis diagram. A general Viterbi decoder will be described below with reference to FIGS. 1 and 2.

FIG. 1 shows a general Viterbi decoder. FIG. 2 shows a unitary trellis diagram having four states. The trellis diagram shown in FIG. 2 is a trellis diagram for a Grand Alliance (GA) high-definition television (HDTV) transmission system. Each state $S_0$, $S_1$, $S_2$ or $S_3$ is represented by "00", "10", "01", and "11", respectively, as shown in FIG. 2.

A branch metric generator (BMG) unit 11 calculates a branch metric according to a state transition from a state at a particular time unit to a state at a next time unit on the trellis diagram, as shown, in FIG. 2, with respect to input data. The branch metric corresponds to a branch which is transitioned to a state at a particular time unit. Each of the states corresponding to a particular time unit has branches which are possibly transitioned to respective states at a next time unit. The number of these branches is determined by the trellis diagram.

An add-compare-selector (ACS) unit 12 receiving the branch metrics applied from the BMG unit 11 determines a survivor path having an optimum partial path metric with respect to each state at the present time unit. More particularly, the ACS unit 12 adds a branch metric and a state metric corresponding to the branch metric, with respect to each branch entering each state at the current time unit. The state metric corresponds to a survivor path of the previous time unit which is connected to an individual branch entering each state at the current time unit. The state metric is a sum of the branch metrics of the branch paths constituting the survivor path at the previous time unit. The branch metric is a metric which a branch connecting between neighboring time units has.

The ACS unit 12 then compares the partial path metrics obtained by the sums of the branch metrics and corresponding state metrics, thereby selecting a partial path corresponding to an optimum partial path metric as a survivor path with respect to a corresponding state at the current time unit. For example, in the case of a binary symmetric channel, a survivor path is a path having a minimum partial path metric. Each state at the current time unit has a corresponding survivor path.

For clarity, a "branch" is defined as a path which is possibly transitioned to a state at the next time unit from a state at a particular time unit, and a "branch path" is defined as a partial survivor path contained in the survivor path between the neighboring time units.

If survivor paths individually corresponding to states at the current time unit are determined, the ACS unit 12 outputs a decision vector representing a branch path which is newly added to each survivor path to a survivor memory device 13. In the case that the trellis diagram shown in FIG. 2 is used, the values of decision vectors individually corresponding to efficient state transitions are represented in the following Table 1.

TABLE 1

| current state | previous state | | | |
|---|---|---|---|---|
| | 00 | 10 | 01 | 11 |
| 00 | 0 | — | 1 | — |
| 10 | 0 | — | 1 | — |
| 01 | — | 0 | — | 1 |
| 11 | — | 0 | — | 1 |

In Table 1, a value of a decision vector is the value in which a current state value corresponds to the previous state value. If the value of a decision vector is "0", this represents a higher state transition in FIG. 2. If the value of a decision vector is "1", this represents a lower state transition. Thus, a previous state connected to a current state can be seen based on the decision vector value and the current state value.

The survivor memory device 13 stores the decision vectors output from the ACS unit 12 and determines a final survivor path with respect to a decoding depth. An existing trace-back method for Viterbi decoding performs a trace-back operation in order to obtain a finally remaining survivor path using the decision vectors, when the decision vectors and the decoding depth are input. The trace-back operation starts at the decision vectors which are input last, and the decision vectors are traced back through the decoding depth. The transmitted data is finally determined by the trace-back process. The management method of the survivor memory device 13 embodying the trace-back method will be described below with reference to FIG. 3.

FIG. 3 is a conceptual diagram for explaining a management method of a survivor memory device according to a conventional trace-back method. The Viterbi algorithm can perform decoding using a trellis diagram of infinite length, which is difficult to realize in hardware. Thus, the survivor memory device 13 is divided into a write region and a read region, as shown in FIG. 3. The write region is used for continuously storing the decision vectors output from the ACS unit 12 and the read region is used for tracing back a survivor path using the prestored decision vectors.

When the read region performs a trace-back operation with respect to the survivor path, newly input decision vectors are recorded in the write region. The read region is divided into a merge block and a decoding block. Survivor paths having higher probabilities are merged by the trace-back method in the merge block, by which an estimation of an initial state for a decoding start in the decoding block is performed. In the decoding block, a trace-back operation for decoding is performed using the estimation of the initial state performed in the merge block, by which decoded data is calculated.

To sequentially calculate decoded data corresponding to the input data, the operation of calculating the decoded data of the survivor memory device 13 should be performed at the same speed as that of the operation of calculating the decision vectors of the ACS unit 12. Two architectures meeting such a condition will be described below.

A one-pointer trace-back architecture uses a single read pointer to perform a trace-back operation. The trace-back operation is completed within the time the read region is filled.

A k-pointer trace-back architecture uses k read pointers and simultaneously traces back k survivor paths. When a write operation is completed with respect to a memory bank, a trace-back operation of a memory bank starts independently and sequentially with respect to other memory banks.

However, when the conventional trace-back method is used to manage the survivor memory devices, the trace-back operation needs to start from the finally input decision vectors to determine decoded data. Accordingly, the previously input decision vectors must be stored, and a last-in-first-out (LIFO) buffer is required.

To perform a trace-back operation in a merge block and a decoding block of one-pointer trace-back architecture, a read operation clock frequency for use in a read region should be several times a write operation clock frequency for use in a write region. Thus, the survivor memory device 13 requires multiple clock frequencies, which makes it difficult to realize a high-speed Viterbi decoder.

The k-pointer trace-back architecture requires 2k independent memory banks, each of which requires a decision length of approximately D/(k-1) with respect to the length D of the merge block. The k-pointer trace-back architecture requires a large capacity memory device. Also, since a multiple read pointer is used, the circuitry is complex.

SUMMARY OF THE INVENTION

To solve the above problems, it is an object of the present invention to provide a survivor memory device in a Viterbi decoder having simple hardware and a small memory capacity by removing branch paths of previous states which are entering in states which are not connected to a next state in a trellis diagram.

To accomplish the above object of the present invention, there is provided a survivor memory device in a Viterbi decoder which determines a final survivor path using a trellis diagram and decision vectors, and outputs decoded data corresponding to the determined survivor path. The survivor memory device includes a path existence information generator for receiving a plurality of decision vectors, each decision vector representing whether a branch path exists between each state and corresponding next states, in the trellis diagram, and generating first branch path existence information representing whether the branch path exists between each state and the corresponding next states in the trellis diagram using the received decision vectors. The survivor memory device also includes a plurality of units which are serially connected with respect to the outputs of the path existence information generator. Each of units has a path existence information store for receiving and storing the first branch path existence information, a path removal signal generator for generating a corresponding path removal signal when the first branch path existence information corresponding to each current state represents that branch paths do not exist between a current state and corresponding next states, and a path existence information updator for receiving the first branch path existence information stored in the path existence information store and the path removal signals generated by the path removal signal generator, and for updating the values of the second branch path existence information corresponding to the current state to represent that the branch path does not exist between the current state and the corresponding previous states. The second branch path existence information represents whether a branch path exists between each state and the corresponding previous states in the trellis diagram.

There is also provided a survivor memory device in a Viterbi decoder which includes a decision vector store for receiving and storing a plurality of decision vectors, each decision vector representing whether a branch path exists between each state and corresponding next states in a trellis diagram, and shifting the stored decision vectors whenever the decision vectors are received to output the shifted result. The survivor memory device also includes a first path existence information generator for receiving the plurality of decision vectors input to the decision vector store, and for generating a first branch path existence information representing whether the branch path exists between each state and corresponding next states in the trellis diagram using the received decision vectors. The survivor memory device further includes a plurality of units which are serially connected with respect to the output of the first path existence information generator and receive the decision vectors output from the decision vector store. Each of the units has a second path existence generator for receiving decision vectors output from the decision vector store and for generating second branch path existence information representing whether the branch path exists between each state and corresponding previous states in the trellis diagram using the received decision vectors, a path removal signal generator for receiving the first branch path existence information output from a preceding end and generating a corresponding path removal signal when the branch path existence information corresponding to each current state represents that branch paths do not exist between a current state and corresponding next states, and a path existence information updator for receiving the second branch path existence information and the path removal signals generated by the path removal signal generator, and for updating the values of the second branch path existence information according to the corresponding path removal signal to represent that branch paths do not exist between the current state and the corresponding previous states. The second branch path existence information represents whether a branch path exists between a current state and the corresponding previous states.

BRIEF DESCRIPTION OF THE DRAWINGS

The preferred embodiments of the present invention are described with reference to the drawings wherein:

FIG. 7 is a block diagram of a survivor memory device in a Viterbi decoder according to another embodiment of the present invention.

DETAILED DESCRIPTION OF THE INVENTION

Figure 1:
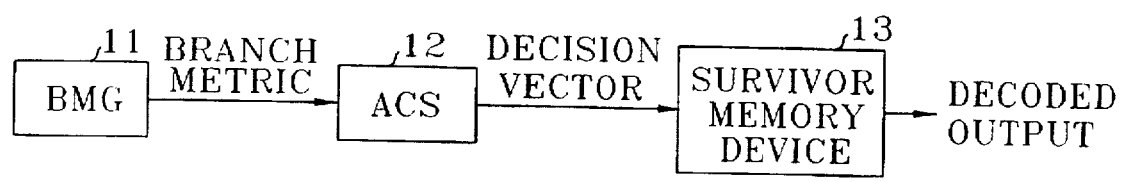
FIG. 1 is a block diagram showing a general Viterbi decoder.

Among the survivor paths determined by decision vectors generated by the ACS unit 12 of FIG. 1, a current state which is not connected to a next state exists. In other words, a current state having no branch path connected to a next state exists. Thus, if a survivor path entering such a current state is removed, only one survivor path usually remains in a survivor memory device at this decoding depth. The present invention realizes such a concept, and does not modify the ACS unit 12 to obtain a desired input.

Figure 4:
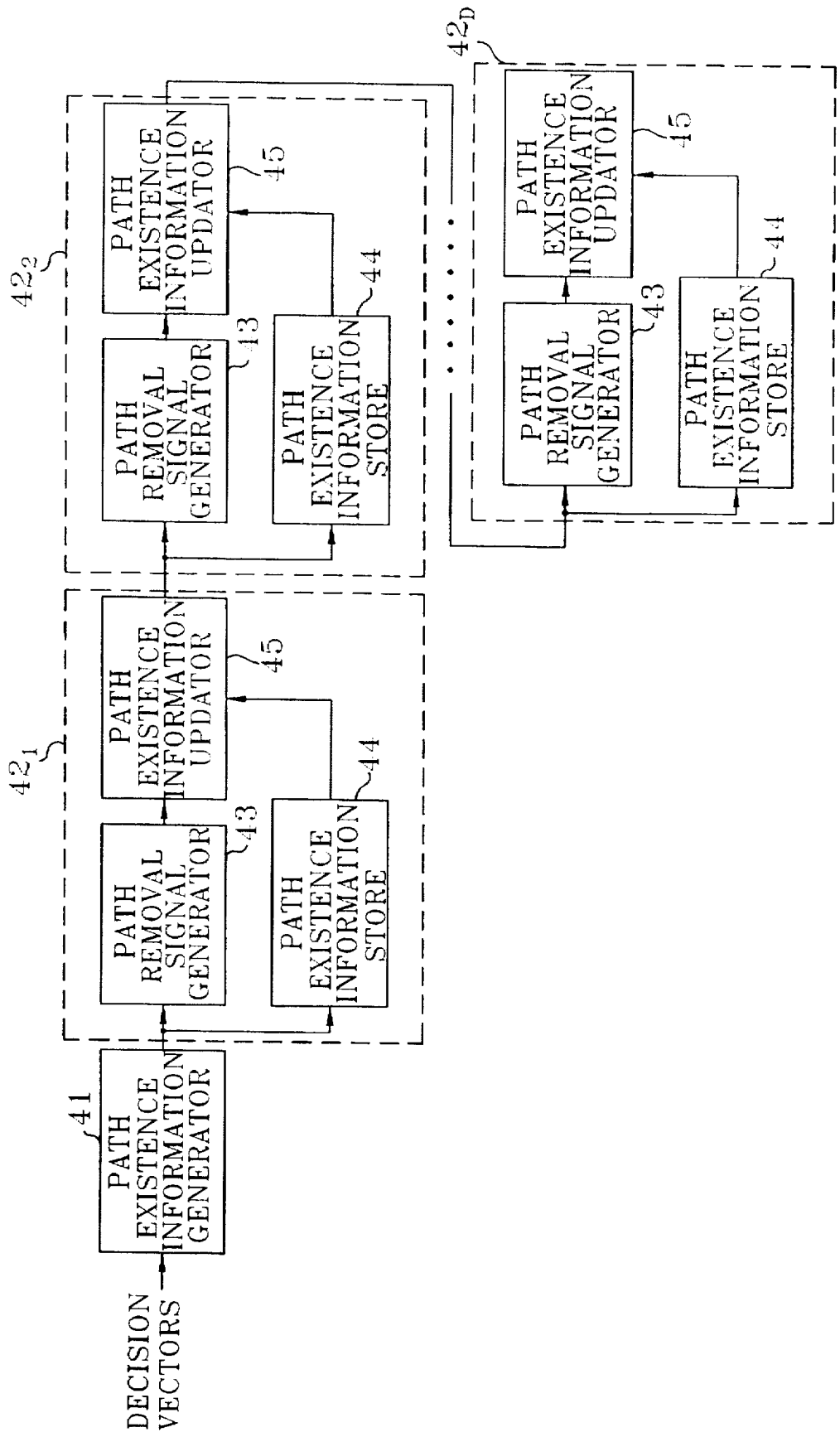
FIG. 4 is a block diagram of a survivor memory device in a Viterbi decoder according to an embodiment of the present invention.

FIG. 4 is a block diagram of a survivor memory device in a Viterbi decoder according to an embodiment of the present invention. The survivor memory device of FIG. 4 includes a path existence information generator 41 and a plurality of units $42_1, 42_2, \ldots, 42_D$. Each unit $42_1, 42_2, \ldots$ and $42_D$ includes a path removal signal generator 43, a path existence information store 44 and a path existence information updator 45. The number D of the units is determined by a decoding depth. The connection between the units is determined by a trellis diagram. A detailed structure of the units will be described further below.

The decision vectors generated in the ACS unit 12 are input to the path existence information generator 41. Each decision vector represents whether a branch path exists between each current state and a corresponding previous state in a trellis diagram employed in a Viterbi decoder. The path existence information generator 41 generates branch path existence information representing whether a branch path exists between each current state and a corresponding next state in a trellis diagram using the received decision vectors. The detailed structure of the path existence information generator 41 will be described with reference to the 4-state trellis diagram of FIG. 2.

Figure 2:
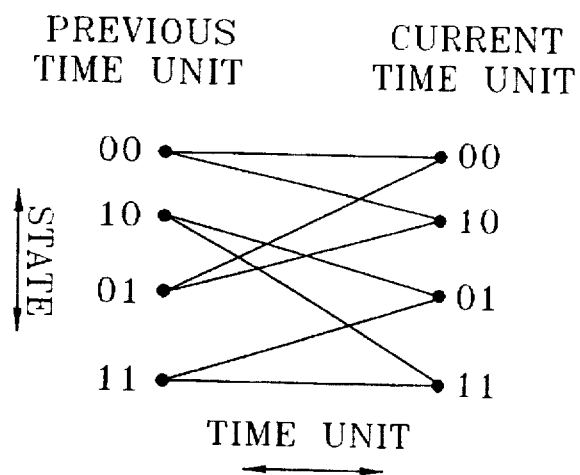
FIG. 2 is a trellis diagram having four states.
Figure 3:
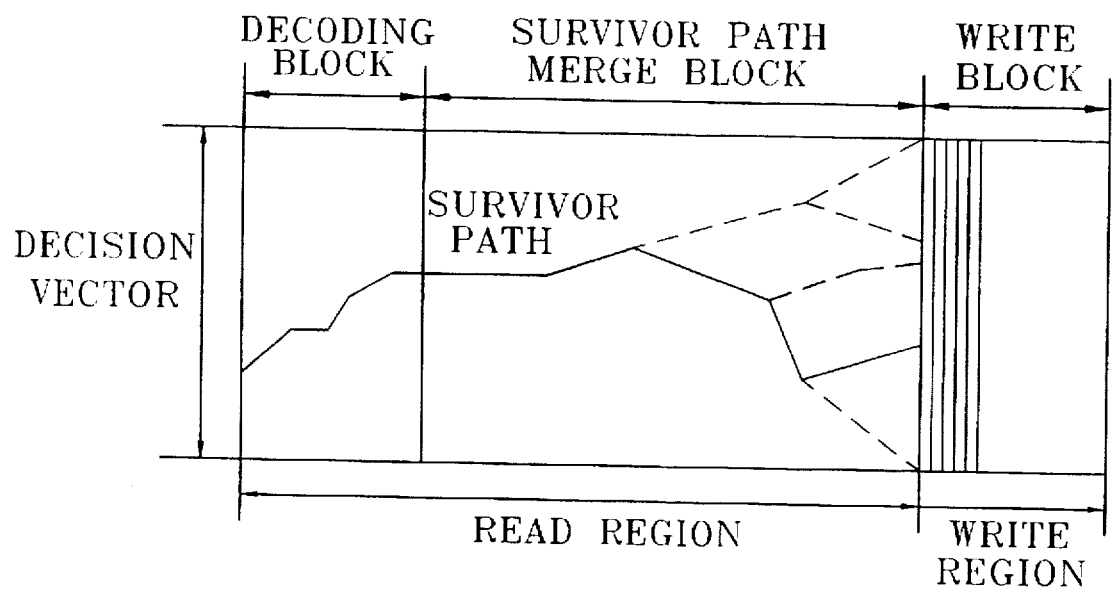
FIG. 3 is a conceptual diagram for explaining a conventional survivor memory management method.
Figure 5:
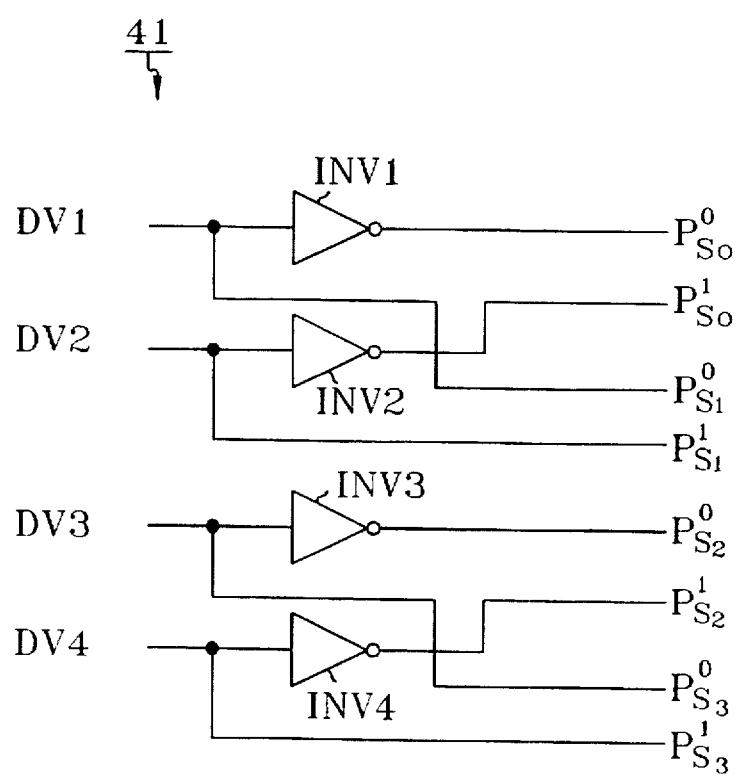
FIG. 5 is a circuit diagram of a branch path existence information generator.

FIG. 5 is a circuit diagram of a path existence information generator 41 which is designed according to the 4-state trellis diagram of FIG. 2. In this case, the path existence information generator 41 includes branch path existence information generators individually corresponding to each state of the 4-state trellis diagram. A first branch path existence information generator includes an input port for receiving a decision vector DV1 corresponding to a current state $S_0$, an inverter INV1 for inverting the value of the decision vector DV1 input via the input port and generating branch path existence information $P_{s0}^0$ having a resultant value, and an output port for outputting the decision vector DV1 input via the input port as the branch path existence information $P_{s0}^1$. Second through fourth branch path existence information generators have the same structure as that of the first branch path existence information generator. The second branch path existence information generator receives a decision vector DV2 corresponding to a current state $S_2$, and outputs branch path existence information $P_{s1}^1$ and branch path existence information $P_{s0}^t$ generated by an inverter INV2. The third branch path existence information generator receives a decision vector DV3 corresponding to a current state $S_1$, and outputs branch path existence information $P_{S3}$ and branch path existence information $P_{S2}^0$ generated by an inverter INV3. The fourth branch path existence information generator receives a decision vector DV4 corresponding to a current state $S_3$, and outputs branch path existence information $P_{s3}^1$ and branch path existence information $P_{s2}^1$ generated by an inverter INV4. In the notation expressing the branch path existence information, a subscript represents a previous state corresponding to a decision vector and a superscript represents whether a branch from a previous state toward a corresponding current state is an upper branch or a lower branch.

In the same manner as the description of the Table 1, a decision vector has a value of "0" with respect to a higher state transition in FIG. 2 and has a value of "1" with respect to a lower state transition therein. A relationship between current states and corresponding decision vectors is represented as the following Table 2.

TABLE 2

| | | previous state | | | | | | | |
|---|---|---|---|---|---|---|---|---|---|
| | | 00 | | 10 | | 01 | | 11 | |
| current state | | 0 | 1 | 0 | 1 | 0 | 1 | 0 | 1 |
| 00 | DV1 = 0 | $P_{S0}^0 = 1$ | | | | | | | |
| | = 1 | | | | | $P_{S1}^0 = 1$ | | | |
| 10 | DV2 = 0 | | | $P_{S0}^1 = 1$ | | | | | |
| | = 1 | | | | | | | $P_{S1}^1 = 1$ | |
| 01 | DV3 = 0 | | | | | $P_{S2}^0 = 1$ | | | |
| | = 1 | | | | | | | | $P_{S3}^0 = 1$ |
| 11 | DV4 = 0 | | | | | | $P_{S2}^1 = 1$ | | |
| | = 1 | | | | | | | | $P_{S3}^1 = 1$ |

In Table 2, the value of "0" or "1" expressed in the second rows represents an upper register or a lower register in a previous state. DV1–DV4 are decision vectors. Therefore, if a current state is "00" (=$S_0$) and a decision vector value is "0," the branch path existence information $P_{s0}^0$ stored in an upper register of the previous state "00" (=$S_0$) has a value of "1." If a current state is "10" (=$S_2$) and a decision vector value is "0," the branch path existence information $P_{s0}^1$ stored in a lower register of the previous state "00" (=$S_0$) has a value of "1." Thus, the present invention can be realized without modifying the existing ACS unit 12 for generating the decision vectors.

The structure of the path existence information generator 41 described referring to FIG. 5 is based on the trellis diagram of FIG. 2. Thus, it is apparent to one skilled in the art that the path existence information generator 12 can be modified so as to be adapted to different structures of the trellis diagram.

The branch path existence information generated by the path existence information generator 41 is input to the path removal signal generator 43 and the path existence information store 44 in the unit $42_1$. For clarity of description, assuming that a time unit corresponding to currently input decision vectors is "j," the detailed construction and operation of the unit $42_1$ will be described with reference to times j+1, j and j−1.

Figure 6:
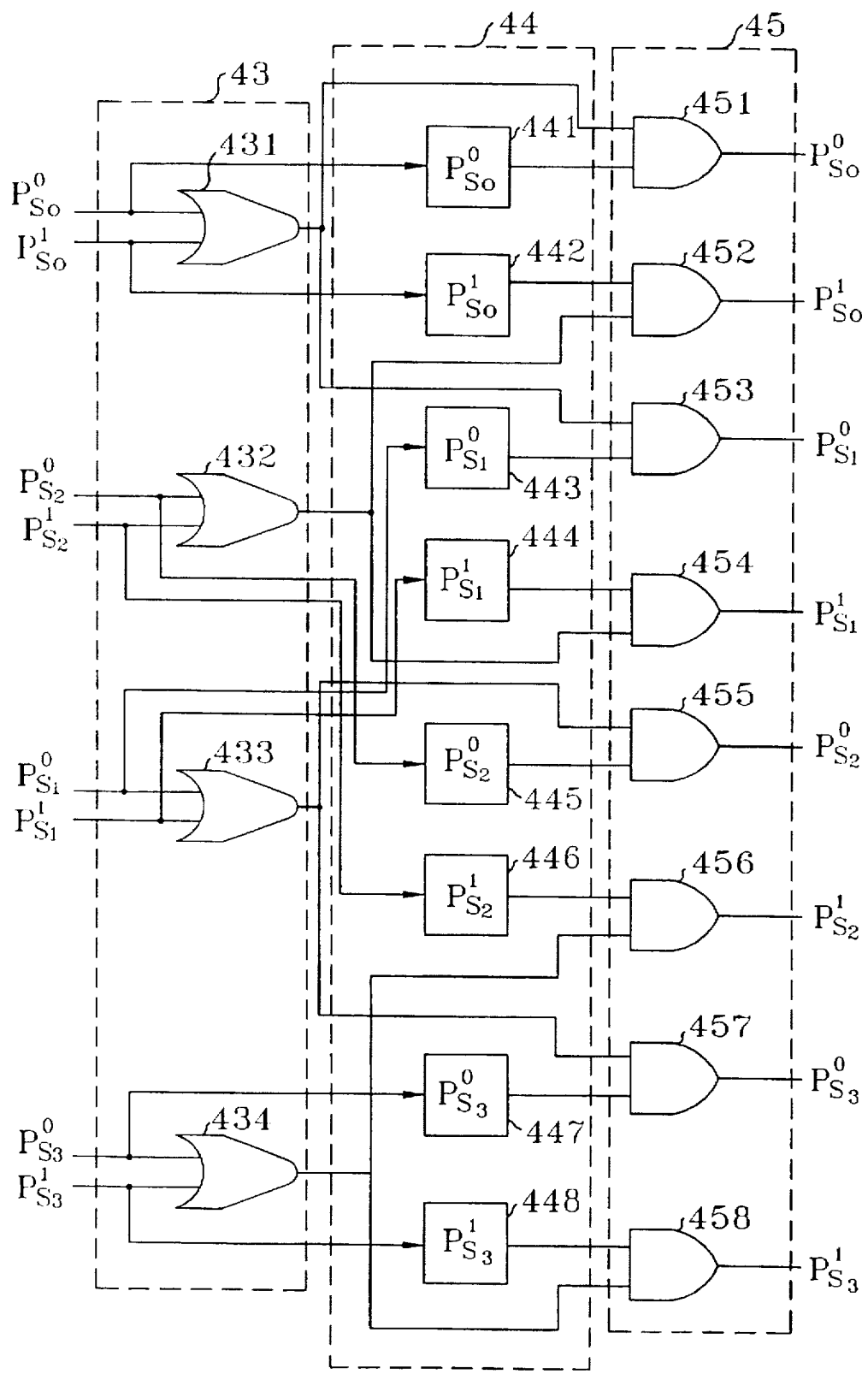
FIG. 6 is a circuit diagram of a unit for updating branch path existence information.

FIG. 6 is a detailed circuit diagram of the unit $42_1$, which is designed according to the 4-state trellis diagram of FIG. 2. The path existence information store 44 includes four first registers 441, 443, 445 and 447 and four second registers 442, 444, 446, and 448. With respect to the branch paths between each state and corresponding states at a next time unit, the first register stores branch path existence information corresponding to an upper branch path, and the second register stores branch path existence information corresponding to a lower branch path. The path existence information store 44 outputs the stored branch path existence information at time j−1, and stores branch path existence information at time j which are newly input from the path existence information generator 41.

The path removal signal generator 43 receives the branch path existence information corresponding to each of the states at time j. The path removal signal generator 43 generates a path removal signal for a corresponding state at time j, when the branch path existence information corresponding to each state at time j represents that branch paths do not exist between the state at time j and the corresponding state at time j+1. If a value of the branch path existence information is expressed as "0" with respect to the state at time j when the branch path connecting the state at time j and the corresponding state at time j+1does not exist, the fact that the value of the sum of the branch path existence information corresponding to each state at time j is "0" represents that there are no branch paths connecting the state toward the states corresponding to time j+1. Therefore, a sum operation is realized by an OR operator. To do so, the path removal signal generator 43 includes OR operators 431-434 individually corresponding to the states. The OR operator 431 logically sums the branch path existence information $P_{s0}{}^0$ and $P_{s0}{}^1$. The OR operator 432 logically sums the branch path existence information $P_{S2}{}^0$ and $P_{S1}{}^1$. The OR operator 433 logically sums the branch path existence information $P_{S1}{}^0$ and $P_{S1}{}^1$. The OR operator 434 logically sums the branch path existence information $P_{S3}{}^0$ and $P_{S3}{}^1$. The branch path existence information obtained by each of these logical sum operations are supplied to the path existence information updator 45.

The path existence information updator 45 receives the branch path existence information output from the path existence information store 44 and the path removal signals generated by the path removal signal generator 43. The path existence information updator 45 updates the value of the branch path existence information at time j−1 according to a corresponding path removal signal. In other words, when there are no branch paths between each state at time j and the corresponding states at time j−1, the path existence information updator 45 alters the values of the corresponding branch path existence information at time j−1 to zero. When no branch paths connecting the particular state at the time j and the corresponding states at time j+1exist, the value of the path removal signal becomes "0." Therefore, with respect to each state at time j−1, new branch path existence information can be obtained for the state by logically multiplying the value of the corresponding path removal signal and the value of the corresponding branch path existence information. To do this, the path existence information updator 45 includes a plurality of AND operators 451-458 for logically multiplying the value of path removal signal and the value of the corresponding branch path existence information, with respect to each state at the time unit j−1, and outputting the result as the updated branch path existence information. Each AND operator logically multiplies the input path removal signal and the corresponding branch path existence information, and generates new branch path existence information having the resultant value. The branch path existence information generated by the path existence information updator 45 is supplied to a next unit. The connection of the signal lines between the neighboring time units is determined by the 4-state trellis diagram shown in FIG. 2. Since such a signal line connection is apparent to those skilled in the art, a detailed description thereof will be omitted.

The branch path existence information can be produced using a state and the decision vector of the state. Therefore, the path removal operation can be performed by storing only decision vectors and using the stored decision vectors. The apparatus realizing the above concept will be described with reference to FIG. 7.

FIG. 7 is a block diagram of a survivor memory device in a Viterbi decoder according to another embodiment of the present invention. The survivor memory device of FIG. 7 is realized based on the 4-state trellis diagram shown in FIG. 2, and performs a path removal operation using decision vectors generated by the ACS unit 12, as does the survivor memory device in FIG. 4. The survivor memory device of FIG. 7 includes a decision vector store 71, a first path existence information generator 72 and a plurality of units $73_1$-$73_D$. The number D of the units is based on the decoding depth.

The decision vector store 71 stores the decision vectors output from the ACS unit 12. The decision vector store 71 also shifts the stored decision vectors whenever the decision vectors are input, and outputs the shifted result. Therefore, the decision vector store 71 is realized using a shift register. The first path existence information generator 72 receives the decision vectors input to the decision vector store 71. The first path existence information generator 72 generates branch path existence information representing whether branch paths exist between each current state and corresponding next states in a trellis diagram using the received decision vectors. The first path existence information generator 72 has the same structure as that of the path existence information generator 41 of FIG. 5, and thus a detailed description thereof will be omitted.

The units $73_1$-$73_D$ are serially connected with respect to the output of the first path existence information generator 72, receive the decision vectors output from the decision vector store 71. Each unit includes a second path existence information generator 74, a path removal signal generator 75 and a path existence information updator 76. The second path existence information generator 74 has the same structure as that of the path existence information generator 41 of FIG. 5, and receives the decision vectors output from the decision vector store 71. The second path existence information generator 74 generates branch path existence information representing whether branch paths exist between each state and corresponding next states in a trellis diagram using the received decision vectors. The path removal signal generator 75 has the same structure as that of the path removal signal generator 43 and receives the branch path existence information from the first path existence information generator 72. The path removal signal generator 75 generates corresponding path removal signals when the branch path existence information represents that corresponding branch paths do not exist between the current state and the corresponding next state. The detailed description of the operation of the path removal signal generator 75 is the same as that of the path removal signal generator 43 of FIG. 6.

Among the plurality of path removal signal generators 75, the path removal signal generator 75 in the unit $73_1$ receives the branch path existence information output from the first path existence information generator 72. The other units $73$–$73_D$ receive the branch path existence information output from the path existence information updator 76 of the preceding unit. The path existence information updator 76 receives the branch path existence information generated by the second path existence information generator 74 and the path removal signals generated by the path removal signal generator 75. The path existence information updator 76 updates the values of the branch path existence information, and performs the same operation as that of the path existence information updator 45 of FIG. 6.

The survivor memory device of FIG. 7 does not store the branch path existence information, but instead uses the decision vectors applied from the decision vector store 71 to generate branch path existence information. Thus, the branch path existence information may not be updated with respect to all the decision vectors stored in the decision vector store 71 within one clock. To prevent such a case, the whole units corresponding to the decoding depth are divided into a number of blocks and separate buffers for storing the branch path existence information obtained in the previous block are used between the blocks. Thus, the path removal operation with respect to the decoding depth within one clock can be performed using the branch path existence information stored in the buffers and the decision vectors output from the decision vector store 71.

The above-described embodiments are constructed to be adapted in the 4-state trellis diagram which is used in the GA HDTV. However, it is apparent to one having ordinary skill in the art that the present invention can be applied to trellis diagrams of other structures.

As described above, the survivor memory device according to the present invention is constructed by repetitive connection of a simple and fundamental structure, which facilitates realization of a semiconductor circuit and minimizes delay of the output data. Also, the operation for removing the survivor paths which are not connected to a next state is performed whenever the decision vectors are input, and can determine decoded data with respect to the input for the entire decoding depth in particularly real time.

While only certain embodiments of the invention have been specifically described herein, it will be apparent that numerous modifications may be made thereto without departing from the spirit and scope of the invention.

What is claimed is:

1. A survivor memory device in a Viterbi decoder which determines a final survivor path using a trellis diagram and a plurality of decision vectors, and outputs decoded data corresponding to the determined survivor path, the survivor memory device comprising:

a path existence information generator for receiving the plurality of decision vectors, the plurality of decision vectors respectively representing whether respective branch paths exist between respective current states and corresponding next states in the trellis diagram, and generating first branch path existence information representing whether the respective branch paths exist between the respective current states and the corresponding next states in the trellis diagram using the received decision vectors; and a plurality of units which are serially connected with respect to an output of said path existence information generator, wherein each of said units comprises:
 a path existence information store for receiving and storing the first branch path existence information;
 a path removal signal generator for generating corresponding path removal signals when the first branch path existence information corresponding to the respective current states represents that respective branch paths do not exist between the respective current states and the corresponding next states; and
 a path existence information updator for receiving the first branch path existence information stored in said path existence information store and the path removal signals generated by said path removal signal generator, and for updating second branch path existence information corresponding to the respective current states to represent that respective branch paths do not exist between the respective current states and corresponding previous states, wherein the second branch path existence information represents whether the respective branch paths exist between the respective current states and the corresponding previous states in the trellis diagram.

2. The survivor memory device according to claim 1, wherein said path existence information generator comprises a plurality of branch path existence information generators respectively corresponding to the states of the trellis diagram, said each branch path existence information generator comprising:

an input port for receiving a corresponding decision vector of the plurality of decision vectors;

an inverter for inverting a value of the corresponding decision vector input via said input port and supplying the first branch path existence information having a resultant value to a corresponding previous state; and an output port for supplying the first branch path existence information having the value of the decision vector input via said input port to another corresponding previous state.

3. The survivor memory device according to claim 1, wherein a number of said plurality of units corresponds to a decoding depth of the device.

4. The survivor memory device according to claim 1, wherein said path existence information store stores the second branch path existence information of the corresponding previous states with respect to the respective current states corresponding to the first branch path existence information applied to said path removal signal generator.

5. The survivor memory device according to claim 4, wherein said path removal signal generator comprises summators for summing the first branch path existence information corresponding to the respective current states and outputting the resultant values as the corresponding path removal signals, and wherein respective values of the first branch path existence information are expressed as "0" when respective branch paths connecting the respective current states and the corresponding next states do not exist.

6. The survivor memory device according to claim 5, wherein said summators are OR operators for logically summing the respective values of the first branch path existence information.

7. The survivor memory device according to claim 5, wherein said path existence information updator comprises a plurality of AND operators for logically multiplying the second branch path existence information and the corresponding path removal signals, and outputting the result as updated second path existence information.

8. A survivor memory device in a Viterbi decoder comprising:

a decision vector store for receiving and storing a plurality of decision vectors, the plurality of decision vectors representing whether respective branch paths exist between respective current states and corresponding next states in a trellis diagram, and shifting the stored decision vectors whenever the plurality of decision vectors are received so as to output a shifted result;

a first path existence information generator for receiving the plurality of decision vectors input to said decision vector store, and for generating first branch path existence information representing whether the respective branch paths exist between the respective current states and the corresponding next states in the trellis diagram using the received decision vectors; and a plurality of units which are serially connected with respect to an output of said first path existence information generator, and receive the decision vectors output from said decision vector store, wherein each of said units comprises:

a second path existence generator for receiving decision vectors output from said decision vector store and for generating second branch path existence information representing whether the respective branch paths exist between the respective current states and corresponding previous states in the trellis diagram using the received decision vectors;

a path removal signal generator for receiving the first branch path existence information output from a preceding end and generating corresponding path removal signals when the branch path existence information corresponding to the respective current states represents that respective branch oaths do not exist between the respective current states and the corresponding next states; and a path existence information updator for receiving the second branch path existence information and the path removal signals generated by said path removal signal generator, and for updating the second branch path existence information according to the corresponding path removal signals to represent that respective branch paths do not exist between the respective current states and the corresponding previous states, wherein the second branch path existence information represents whether the respective branch paths exist between the respective current states and the corresponding previous states.

9. The survivor memory device according to claim 8, wherein said first path existence information generator comprises a plurality of branch path existence information generators respectively corresponding to the states of the trellis diagram, said each branch path existence information generator comprising:

an input port for receiving a decision vector of the plurality of decision vectors input to said decision vector store;

an inverter for inverting a value of the corresponding decision vector input via said input port and supplying the first branch path existence information having a resultant value to a corresponding previous state; and an output port for supplying the first branch path existence information having the value of the decision vector input via said input port to another corresponding previous state.

10. The survivor memory device according to claim 8, wherein a number of said plurality of units corresponds to a decoding depth of the device.

11. The survivor memory device according to claim 8, wherein said second path existence information generator generates the second branch path existence information of a state previous to a state of the first branch path existence information applied to said path removal signal generator.

12. The survivor memory device according to claim 8, wherein said first path existence information generator comprises a plurality of branch path existence information generators respectively corresponding to the states of the trellis diagram, said each branch path existence information generator comprising:

an input port for receiving a decision vector of the plurality of decision vectors output from said decision vector store;

an inverter for inverting a value of the corresponding decision vector input via said input port and supplying the first branch path existence information having a resultant value to a corresponding previous state; and an output port for supplying the first branch path existence information having the value of the decision vector input via said input port to another corresponding previous state.

13. The survivor memory device according to claim 12, wherein said path removal signal generator comprises summators for summing the first branch path existence information and outputting the resultant values as the corresponding path removal signals, and wherein the value of the first branch path existence information is expressed as "0" when respective branch paths connecting the respective current states and the corresponding next states do not exist.

14. The survivor memory device according to claim 13, wherein said summators are OR operators for logically summing the respective values of the first branch path existence information.

15. The survivor memory device according to claim 14, wherein said path existence information updator comprises a plurality of AND operators for logically multiplying the second branch path existence information and the corresponding path removal signals, and outputting the result as updated second branch path existence information.

* * * * *